United States Patent
Le et al.

(10) Patent No.: US 6,389,086 B1
(45) Date of Patent: May 14, 2002

(54) DIGITAL CIRCUIT HAVING A FILTER UNIT FOR SUPPRESSING GLITCHES

(75) Inventors: Thoai-Thai Le, München; Eckhard Brass, Unterhaching; Markus Biebl, Augsburg, all of (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/521,396

(22) Filed: Mar. 8, 2000

Related U.S. Application Data

(63) Continuation of application No. PCT/DE98/02476, filed on Aug. 24, 1998.

(30) Foreign Application Priority Data

Sep. 8, 1997 (DE) .......................................... 197 39 245

(51) Int. Cl.[7] ................................................. H03B 1/10
(52) U.S. Cl. ...................... 375/350; 375/285; 327/379; 327/551
(58) Field of Search ...................... 326/26, 27; 365/233, 365/233.5; 375/360, 350, 285; 327/172, 180, 379, 551, 552, 558

(56) References Cited

U.S. PATENT DOCUMENTS

| 4,486,752 A | 12/1984 | Chikah | 340/825.63 |
|---|---|---|---|
| 4,716,318 A | 12/1987 | Koike | 327/558 |
| 4,757,214 A | 7/1988 | Kobayashi | 327/172 |
| 4,965,474 A | * 10/1990 | Childers et al. | 327/180 |
| 5,006,725 A | * 4/1991 | Nawaki et al. | 307/106 |
| 5,187,385 A | * 2/1993 | Koike | 327/198 |
| 5,198,710 A | * 3/1993 | Houston | 327/552 |
| 5,289,060 A | * 2/1994 | Elnashar et al. | 327/552 |
| 5,336,938 A | * 8/1994 | Sywyk | 327/176 |
| 6,037,827 A | * 3/2000 | Fisch | 327/379 |

FOREIGN PATENT DOCUMENTS

| EP | 0009549 A1 | 4/1980 |
|---|---|---|
| EP | 0309849 A1 | 4/1989 |

* cited by examiner

*Primary Examiner*—Stephen Chin
*Assistant Examiner*—Chieh M. Fan
(74) *Attorney, Agent, or Firm*—Herbert L. Lerner; Laurence A. Greenberg; Werner H. Stemer

(57) ABSTRACT

A digital circuit has a signal input terminal and a signal output terminal. The digital circuit additionally has a logic circuit unit, whose input is connected to the signal input terminal and whose output is connected to the signal output terminal via a switching element. Furthermore, it has a filter unit, whose input is connected to the signal input terminal and whose output is connected to a control input of the switching element. The filter unit serves for suppressing glitches on a digital signal present at its input.

2 Claims, 3 Drawing Sheets

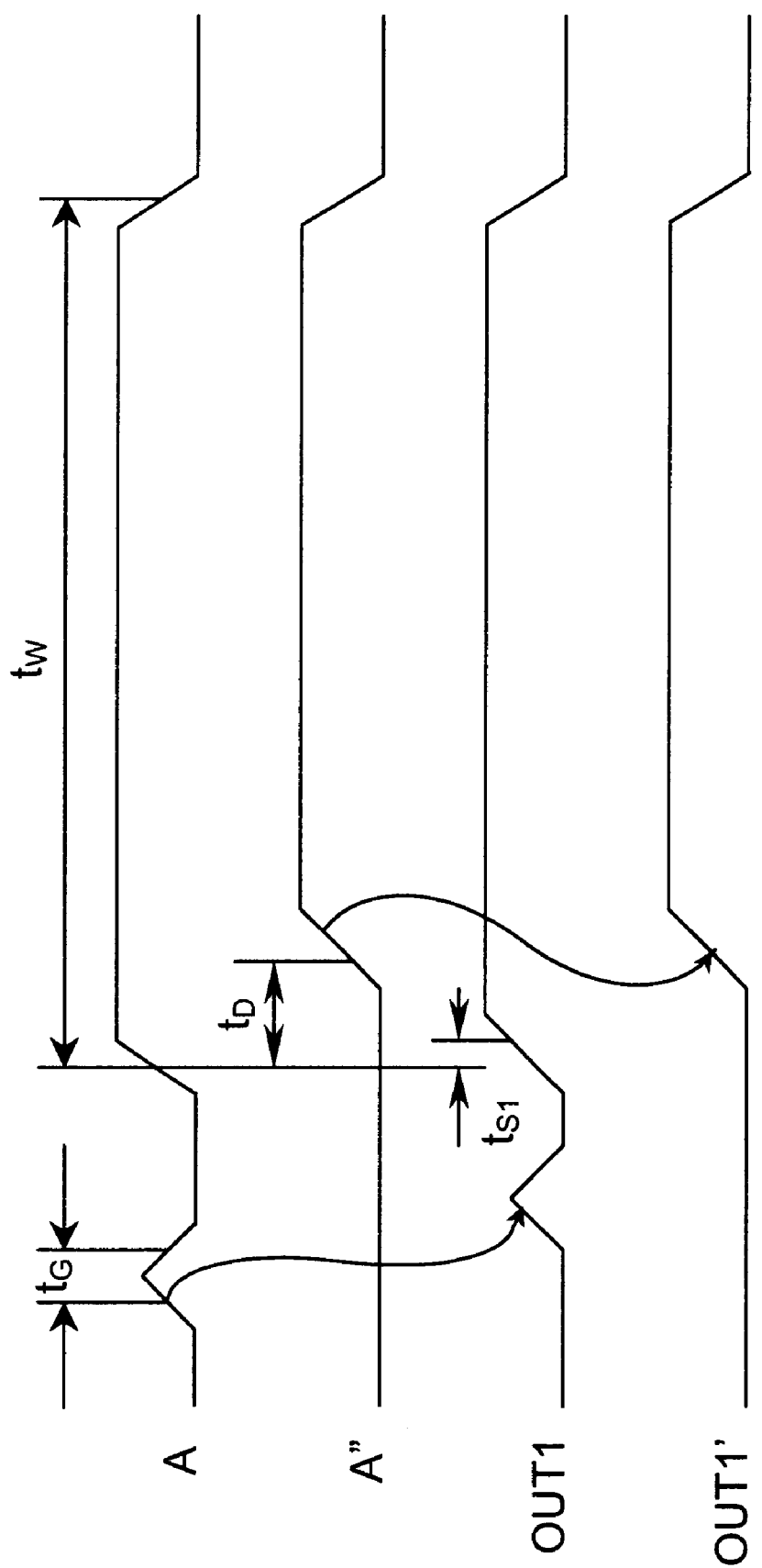

DIGITAL CIRCUIT HAVING A FILTER UNIT FOR SUPPRESSING GLITCHES

CROSS-REFERENCE TO RELATED APPLICATION

This is a continuation of copending International Application PCT/DE98/02476, filed Aug. 24, 1998, which designated the United States.

BACKGROUND OF THE INVENTION

Field of the Invention

The invention relates to a digital circuit having a filter unit for suppressing glitches.

A known digital circuit is formed of logic circuit units to which an input signal is intended to be fed via an input of the digital circuit. Corresponding output signals are then established at outputs of the circuit units. Since, under certain circumstances, the input signal may have glitches, which are not intended to have an effect on the signals at the outputs, a filter is provided to which the input signal perturbed by glitches is fed and which generates from this a signal which is free from glitches. The filtered signal is then fed to the circuit units.

The prior art described has the disadvantage that the use of the filter unit, which produces the filtered signal to be delayed relative to the input signal, increases the overall delay or signal propagation delay between the input signal and the output signals at the outputs. The delay between the output and the input is calculated for example from the sum of the delay caused by the filter unit and the delay caused by the first circuit unit.

U.S. Pat. No. 4,716,318 describes a low-pass filter for an integrated circuit which has two low-pass filter elements disposed essentially in parallel with one another, of which elements one is provided for the purpose of filtering positive glitches and one is provided for the purpose of filtering negative glitches, and which elements are logically combined with one another on the output side via a flip-flop formed by NOR gates.

SUMMARY OF THE INVENTION

It is accordingly an object of the invention to provide a digital circuit having a filter unit for suppressing glitches which overcomes the above-mentioned disadvantages of the prior art devices of this general type, in which glitches in an input signal are suppressed without the signal propagation delays between the input signal and an output signal of the circuit being significantly increased as a result of this.

With the foregoing and other objects in view there is provided, in accordance with the invention, a digital circuit, including:

a signal input terminal;

at least two signal output terminals outputting final output signals;

switching elements each having a control input and each connected to one of the signal output terminals;

at least two logic circuit units for performing logic operations resulting in logic output signals, each of the logic circuit units having an input connected to the signal input terminal and an output connected to one of the signal output terminals via a respective one of the switching elements, a level change at the input of the logic circuit units results in a level change at the output of the logic circuit units; and a filter unit having an input connected to the signal input terminal and an output connected to the control input of each of the switching elements, the filter unit suppressing glitches on a digital signal received at the input and outputs a filtered signal without the glitches at the output, the filtered signal being received by the control input of each of the switching elements for controlling operating states of the switching elements including a first operating state and a second operating state, in the first operating state of the switching elements the final output signals at the signal output terminals correspond to the logic output signals of the logic circuit units, in the second operating state of the switching elements the final output signals at the signal output terminals being independent of the logic output signals of the logic circuit units, the filter unit initially holding the switching elements in the second operating state prior to a level change of the digital signal at the signal input terminal and putting the switching elements into the first operating state in an event of the level change occurring after a time delay being longer than a signal propagation delay between the input and the output of one of the logic circuit units for which the signal propagation delay is greatest.

The digital circuit according to the invention has, between a signal input and at least two signal outputs, at least two logic circuit units whose outputs are connected to one of the the signal outputs of the digital circuit via a respective switching element. In this case, a level change of an output signal is established at the output of the logic circuit units in dependence on level changes of a signal at the input of the logic circuit unit. Furthermore, the digital circuit has a filter unit whose input is likewise connected to the signal input and whose output is connected to a control input of the switching elements, the filter unit suppressing glitches on a digital signal present at its input.

In the case of the invention, the input signal, which may be perturbed by glitches, at the signal input is fed unfiltered to the logic circuit units, which serve to carry out combinational logic functions (switching network), with the result that the output signal at the output of the logic circuit units is influenced by the glitches. In parallel with the logic circuit units, however, the input signal is also fed to the filter unit, which generates a filtered signal having fewer or, in the most favorable case, no glitches at all relative to the input signal. The filtered signal then serves for controlling the switching elements, which are expediently a logic gate, e.g. an AND or OR gate. The effect achieved by using the filtered signal to drive the switching elements is that those parts of the output signal of the logic circuit units which are influenced by the glitches in the input signal are not switched through to the signal outputs of the digital circuit.

The invention has the advantage that output signals which are free from glitches in the input signal at the signal input are obtained at the signal outputs of the digital circuit without the overall delay between these signals being significantly longer than the signal propagation delay through the logic circuit units. The digital circuit according to the invention is thus faster than the prior art circuits.

Other features which are considered as characteristic for the invention are set forth in the appended claims.

Although the invention is illustrated and described herein as embodied in a digital circuit having a filter unit for suppressing glitches, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 6 is a timing diagram of signal profiles relating to the exemplary embodiment illustrated in FIG. 2.

DESCRIPTION OF THE PREFERRED EMBODIMENTS

Figure 1:
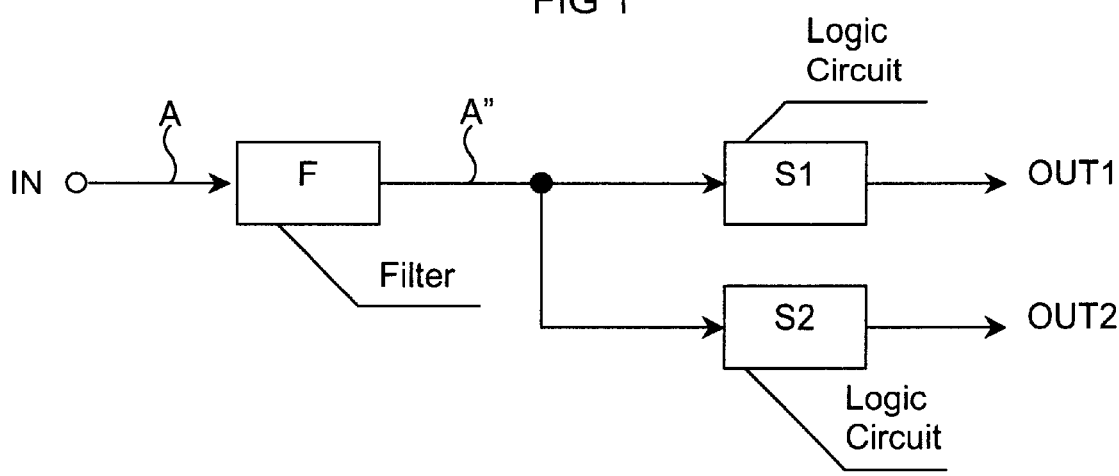
FIG. 1 is a block diagram of an integrated circuit according to the prior art.

In all the figures of the drawing, sub-features and integral parts that correspond to one another bear the same reference symbol in each case. Referring now to the figures of the drawing in detail and first, particularly, to FIG. 1 thereof, there is shown a known digital circuit. Logic circuit units S1, S2 are illustrated, to which an input signal A is intended to be fed via an input IN of the digital circuit. Corresponding output signals a re then established at outputs OUT1, OUT2 of the circuit units S1, S2. Since, under certain GR 97 P 2322 circumstances, the input signal A may have glitches, which are not intended to have an effect on the signals at the outputs OUT1, OUT2, the circuit in FIG. 1 has a filter F, to which the input signal A perturbed by glitches is fed and which generates from this a signal A" which is free from glitches. The filtered signal A" is then fed to the circuit units S1, S2.

The prior art described has the disadvantage that the use of the filter unit F, which causes the filtered signal A" to be delayed relative to the input signal A, increases the overall delay or signal propagation delay between the input signal A and the output signals at the outputs OUT1, OUT2. The delay between the output OUT1 and the input IN is calculated for example from the sum of the delay caused by the filter unit F and the delay caused by the first circuit unit S1.

Figure 2:
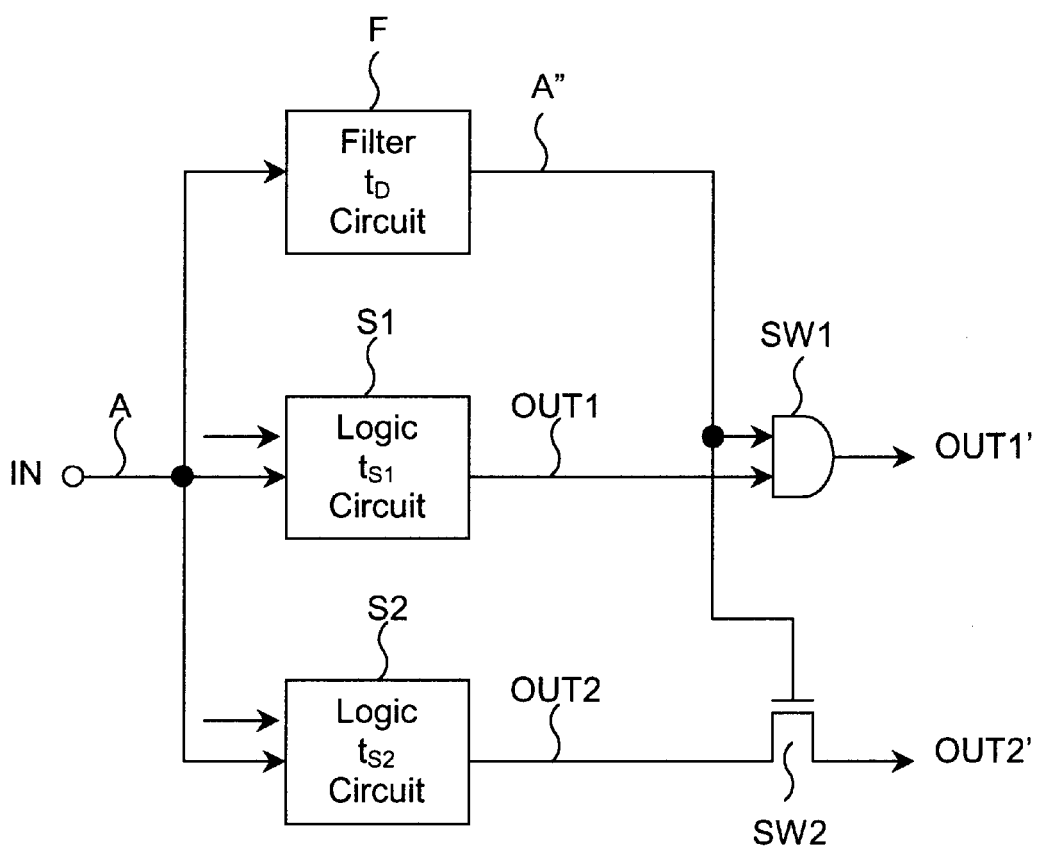
FIG. 2 is a block diagram of an exemplary embodiment of a digital circuit according to the invention.

In accordance with the invention, FIG. 2 shows a digital circuit having the signal input IN, a first signal output OUT1' and a second signal output OUT2'. A respective switching element SW1, SW2 is connected upstream of the signal outputs OUT1', OUT2'. The first switching element SW1 is an AND gate and the second switching element SW2 is an n-channel transistor. The first logic circuit unit S1 is connected to the signal input IN on an input side and to an input of the first switching element SW1 on the output side. The second logic circuit unit S2 is likewise connected to the signal input on an input side and to the second signal output OUT2' via the second switching element SW2 on an output side.

In this exemplary embodiment, the logic circuit units S1, S2 are switching networks for performing combinational logic functions. The invention can also be applied to other circuit units. For all of the circuit units S1, S2, however, it must hold true that an output signal is established at the output OUT1, OUT2 after a certain signal propagation delay, the level change of which output signal is dependent on level changes of an "active high" input signal A at the signal input IN. FIG. 2 also indicates that the logic circuit units S1, S2 may have further inputs not connected to the signal input IN. Moreover, the circuit units S1, S2 may also have further outputs.

FIG. 2 furthermore shows the filter unit F. whose input is connected to the signal input IN and whose output is connected to a respective control input of the switching elements SW1, SW2. The control input of the first switching element SW1 is a further input of the AND gate. The control input of the second switching element SW2 is a gate terminal of the n-channel transistor. It goes without saying that the switching elements SW1, SW2 can also be realized in other ways, in particular that they are of the same type in both cases, for example both AND gates. The filter unit F serves for generating, from the input signal A, the filtered signal A" in which glitches possibly exhibited by the input signal A are suppressed. The filtered signal A" is used to drive the switching elements SW1, SW2.

Figure 3:
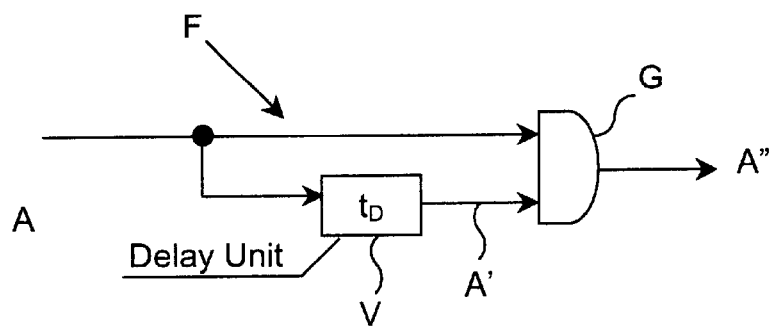
FIGS. 3 and 4 are circuit block diagrams of exemplary embodiments of a filter unit from FIG. 2.

FIG. 3 shows an exemplary embodiment of the filter unit F from FIG. 2. It serves for filtering positive glitches on the input signal A, whose active level is the high level ("active high"). The filter unit F has an AND gate G, at whose output the filtered signal A" is established. The input signal A is fed to a first input of the AND gate G. The input signal A is fed to a second input of the AND gate G via a delay unit V with a time delay $t_D$, as delayed input signal A'.

Figure 5:
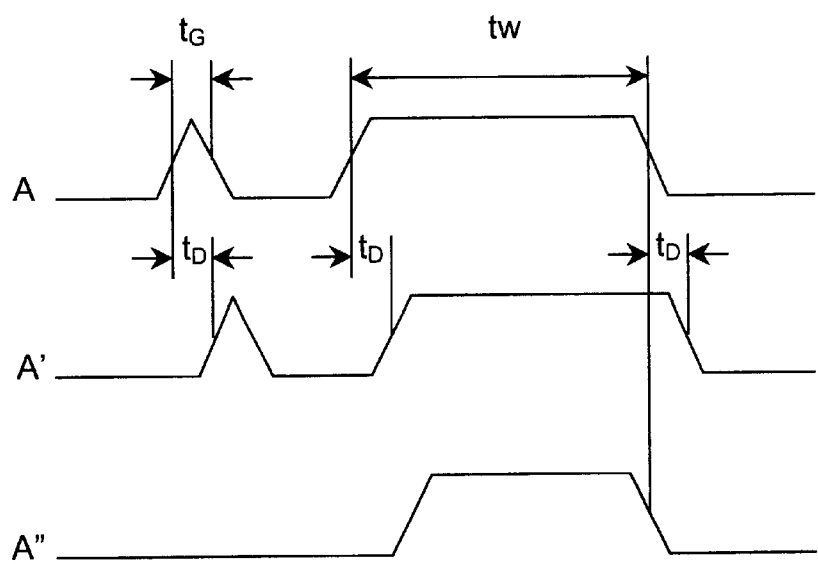
FIG. 5 is a timing diagram of a signal profile relating to the filter unit from FIG. 3.

FIG. 5 shows an exemplary signal profile for the signals illustrated in FIG. 3. The input signal A has a positive glitch with a width $t_G$ before the actual useful signal with a width $t_W$ occurs. The delayed signal A' at the output of the delay unit V is shifted by the delay time $t_D$ of the delay unit V relative to the input signal A. Accordingly, the profile that is shown is produced for the filtered signal A", the filtered signal A" only having a high level when both the input signal A and the delayed signal A' have a high level. The switching elements SW1, SW2 in FIG. 2 are activated only during the high level of the filtered signal A", as will be explained further below with reference to FIG. 6.

In order to ensure that glitches on the input signal A will be suppressed by the filter unit F, the delay $t_D$ of the delay unit V in FIG. 3 must be greater than the width $t_G$ of the glitch. Glitches with a greater width $t_G$ are not suppressed by the filter unit. Of course, the delay $t_D$ must be shorter than the width $t_W$ of the useful signal.

Figure 4:
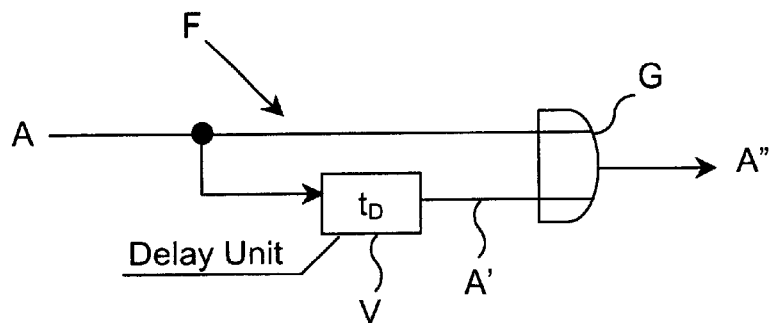

FIG. 4 shows a further exemplary embodiment of the filter unit F for filtering negative glitches on an input signal that is "active low". The difference from the filter unit F as shown in FIG. 3 is that an OR gate G is used instead of the AND gate. When the filter unit F as shown in FIG. 4 is used, it is also necessary, if appropriate, to change the type of switching elements SW1, SW2 in FIG. 2. Otherwise, the method of operation is analogous to that which is explained below with regard to the filter unit F from FIG. 3.

FIG. 6 shows signal profiles of some of the signals illustrated in FIG. 2. The input signal A and the filtered signal A" have already been discussed with reference to FIG. 5. Furthermore, FIG. 6 shows the profile of the output signal OUT1 of the first logic circuit unit S1. This signal has level changes that are dependent on level changes of the input signal A. Relative to the input signal A, the output signal OUT1 has a signal delay $t_{S1}$, which is shorter than the delay $t_D$ caused by the filter unit F or the delay unit V thereof.

FIG. 6 illustrates a profile of the output signal OUT1. The output signal OUT1 has level changes caused by the glitch on the input signal A. Such a level change caused by the glitch is not intended, however, to appear at the output OUT1' of the digital circuit, since this will impair the functioning of circuit units connected downstream. FIG. 6 reveals that the signal at the output OUT1 of the first circuit unit S1 is delayed by the propagation delay $t_{S1}$ thereof.

FIG. 6 also illustrates the signal profile of the output signal OUT1' at the signal output of the digital circuit. It is evident that, on account of the first switching element SW1 being driven, according to the invention, by the filtered signal A'', the level change, triggered by the glitch in the input signal A, of the output signal OUT1 at the output of the first logic circuit unit S1 is not passed on to the signal output OUT1'.

In a departure from the illustration in FIG. 2, the digital circuit according to the invention can also have merely one of the logic circuit units S1, S2 connected to the signal input IN, or else more than two. For the circuit to function without any errors, it is always necessary for the delay time $t_D$ of the filter unit F to be longer than the delay time $t_{S1}$, $t_{S2}$ of that logic circuit unit S1, S2 for which this value is the highest. Furthermore, it is necessary for the width $t_W$, illustrated in FIGS. 5 and 6, of the useful signal of the input signal A to be greater than the signal propagation delay $t_{S1}$, $t_{S2}$ of the slowest logic circuit unit S1, S2.

FIG. 6 reveals that, in the case of the invention, the signal at the signal output OUT1' of the digital circuit is advantageously delayed in total only by the delay time $t_D$ of the filter unit F relative to the input signal A (plus the propagation delay of the switching element SW1). The digital circuit according to the invention is thus faster than the circuit shown in FIG. 1, in which the output signal OUT1 is delayed relative to the input signal A by the sum of the delay time of the filter unit F (which is dependent on the maximum width $t_G$ of the glitches to be suppressed) and the signal propagation delay of the logic circuit unit S1. In the case of the invention, the total delay is equal to the delay $t_D$ of the filter unit F. As already explained, this has to be only slightly longer than the propagation delay $t_{S1}$ of the circuit unit S1.

The invention is suitable for increasing the interference immunity of asynchronous digital systems of the kind present for example in some memories, in particular DRAMs. In the case of a DRAM, the invention is suitable for example for generating internal output enable, write enable, CAS (Column Address Strobe) or RAS (Row Address Strobe) signals from corresponding external signals that may be perturbed by glitches.

In the case of the invention, given the same total delay of the system, the delay time $t_D$ of the filter unit F can be chosen to be longer than in the case of the prior art explained with reference to FIG. 1. Therefore, in the case of the invention, given the same total delay of the circuit, it is possible to suppress glitches with a greater width $t_G$ than has been the case heretofore.

The invention also has a further advantage over the circuit from FIG. 1. The instants of the level changes of the output signals OUT1, OUT2 of the circuit in FIG. 1 are each exclusively dependent on the signal propagation delay caused by the corresponding logic circuit unit S1, S2. In the case of the invention, in contrast, the instants of the level changes of the signals at the signal outputs OUT1', OUT2' are synchronized with one another on account of the switching elements SW1, SW2 being driven by the common filtered signal A'', with the result that the time response of the entire system can be predetermined significantly more easily.

We claim:

1. A digital circuit, comprising:

a signal input terminal for receiving a digital signal;

at least two signal output terminals outputting final output signals;

switching elements each having a control input and each connected to one of said signal output terminals;

at least two logic circuit units for performing logic operations resulting in logic output signals, each of said logic circuit units having an input connected to said signal input terminal to receive the digital signal and an output connected to one of said signal output terminals via a respective one of said switching elements, a level change at said input of said logic circuit units results in a level change at said output of said logic circuit units; and a filter unit having an input connected to said signal input terminal to receive the digital signal and an output connected to said control input of each of said switching elements, said filter unit suppressing glitches having a width smaller than a predetermined time delay on the digital signal received at said input, said filter unit outputting a filtered signal without the glitches at said output, the filtered signal being received by said control input of each of said switching elements for controlling operating states of said switching elements including a first operating state and a second operating state, in said first operating state of said switching elements said final output signals at said signal output terminals correspond to the logic output signals of said logic circuit units, in said second operating state of said switching elements the final output signals at said signal output terminals being independent of the logic output signals of said logic circuit units, said filter unit initially holding said switching elements in the second operating state prior to a level change of the digital signal at said signal input terminal and putting said switching elements into the first operating state in an event of the level change occurring after the predetermined time delay, the predetermined time delay being longer than a signal propagation delay between said input and said output of one of said logic circuit units for which the signal propagation delay is greatest.

2. The digital circuit according to claim 1, wherein said switching elements are selected from the group consisting of logic gates and transistors.

* * * * *